United States Patent [19]

Hartless et al.

[11] Patent Number: 4,860,373
[45] Date of Patent: Aug. 22, 1989

[54] LOCATION DEPENDENT SIGNAL PROCESSOR

[75] Inventors: Mac L. Hartless, Sauquoit; Alan L. Johnson, Utica, both of N.Y.

[73] Assignee: General Electric Company, Utica, N.Y.

[21] Appl. No.: 845,961

[22] Filed: Mar. 31, 1986

[51] Int. Cl.⁴ .............................................. G06K 9/30
[52] U.S. Cl. ..................................... 382/41; 382/27; 382/50; 382/54
[58] Field of Search ................. 382/54, 27, 49, 50, 382/51; 358/284

[56] References Cited

U.S. PATENT DOCUMENTS

| | | | |
|---|---|---|---|
| 4,298,895 | 11/1981 | Arai | 382/51 |
| 4,434,502 | 2/1984 | Arakawa | 382/41 |
| 4,475,234 | 10/1984 | Nishijima | 382/50 |
| 4,484,346 | 11/1984 | Sternberg | 382/27 |
| 4,485,408 | 11/1984 | Kamizyo | 358/283 |
| 4,491,964 | 1/1985 | Sanner | 382/54 |
| 4,503,461 | 3/1985 | Nishimura | 358/282 |
| 4,543,660 | 9/1985 | Maeda | 382/41 |
| 4,547,811 | 10/1985 | Ochi | 358/283 |
| 4,550,437 | 10/1985 | Kobayashi | 382/41 |
| 4,554,593 | 11/1985 | Fox | 382/54 |

Primary Examiner—Leo H. Boudreau
Assistant Examiner—Jose L. Couso
Attorney, Agent, or Firm—Carl W. Baker; Richard V. Lang

[57] ABSTRACT

A location dependent signal processor for radiant energy detector arrays which include two-dimensional spatial filtering and/or background normalizing, with means providing programmed control of the signal processor filter weighting and normalizer thresholding operations as a function of the location of each successive output pixel with respect to the periphery of the detector array, so as to enable the signal processor to minimize the effects of initialization and wrap-around pixels on the processor signal output.

10 Claims, 4 Drawing Sheets

FIG. 1

| A | A' | | B' | B |
|---|---|---|---|---|
| A' | A' | | B' | B' |
| F | F' | I | G' | G |
| E | E' | | H' | H |
| E | E' | | D' | D' |
| E | E' | | D' | D |

FIG. 3 LOCATION DEPENDENT SPATIAL FILTERS $$A = \begin{bmatrix} 0 & 0 & 0 \\ 0 & 1 & -1 \\ 0 & -1 & 1 \end{bmatrix} \quad B = \begin{bmatrix} 0 & 0 & 0 \\ -1 & 1 & 0 \\ 1 & -1 & 0 \end{bmatrix} \quad C = \begin{bmatrix} 1 & -1 & 0 \\ -1 & 1 & 0 \\ 0 & 0 & 0 \end{bmatrix}$$

$$D = \begin{bmatrix} 0 & -1 & 1 \\ 0 & 1 & -1 \\ 0 & 0 & 0 \end{bmatrix} \quad E\&G = \begin{bmatrix} 0 & -1/2 & 0 \\ 0 & 1 & 0 \\ 0 & -1/2 & 0 \end{bmatrix} \quad F\&H = \begin{bmatrix} 0 & 0 & 0 \\ -1/2 & 1 & -1/2 \\ 0 & 0 & 0 \end{bmatrix}$$

$$I = \begin{bmatrix} 1/4 & -1/2 & 1/4 \\ -1/2 & 1 & -1/2 \\ 1/4 & -1/2 & 1/4 \end{bmatrix} \quad OR \quad I = \begin{bmatrix} -1/8 & -1/8 & -1/8 \\ -1/8 & 1 & -1/8 \\ -1/8 & -1/8 & -1/8 \end{bmatrix}$$

FIG. 7 LOCATION DEPENDENT BACKGROUND NORMALIZERS $$A \text{ OR } A' = \begin{bmatrix} 0 & 0 & 0 & 0 & 0 \\ 0 & 0 & 0 & 0 & 0 \\ 0 & 0 & 0 & 2 & 2 \\ 0 & 0 & 2 & 2 & 0 \\ 0 & 0 & 2 & 0 & 0 \end{bmatrix} \quad B \text{ OR } B' = \begin{bmatrix} 0 & 0 & 0 & 0 & 0 \\ 0 & 0 & 0 & 0 & 0 \\ 0 & 2 & 2 & 0 & 0 \\ 0 & 2 & 2 & 0 & 0 \\ 0 & 0 & 2 & 2 & 0 \end{bmatrix} \quad C \text{ OR } C' = \begin{bmatrix} 0 & 0 & 2 & 2 & 0 \\ 0 & 2 & 2 & 0 & 0 \\ 0 & 2 & 0 & 0 & 0 \\ 0 & 0 & 0 & 0 & 0 \\ 0 & 0 & 0 & 0 & 0 \end{bmatrix} \quad D \text{ OR } D' = \begin{bmatrix} 0 & 0 & 2 & 2 & 0 \\ 0 & 0 & 0 & 2 & 2 \\ 0 & 0 & 0 & 2 & 0 \\ 0 & 0 & 0 & 0 & 0 \\ 0 & 0 & 0 & 0 & 0 \end{bmatrix}$$

$$E \text{ OR } E' = \begin{bmatrix} 0 & 0 & 2 & 0 & 0 \\ 0 & 0 & 2 & 0 & 0 \\ 0 & 2 & 0 & 2 & 0 \\ 0 & 0 & 2 & 0 & 0 \\ 0 & 0 & 2 & 0 & 0 \end{bmatrix} \quad F \text{ OR } F' = \begin{bmatrix} 0 & 0 & 0 & 0 & 0 \\ 0 & 0 & 0 & 0 & 0 \\ 2 & 2 & 0 & 2 & 2 \\ 0 & 0 & 0 & 0 & 0 \\ 0 & 0 & 0 & 0 & 0 \end{bmatrix} \quad G \text{ OR } G' = \begin{bmatrix} 0 & 0 & 2 & 0 & 0 \\ 0 & 0 & 2 & 0 & 0 \\ 0 & 2 & 0 & 2 & 0 \\ 0 & 0 & 2 & 0 & 0 \\ 0 & 0 & 2 & 0 & 0 \end{bmatrix} \quad H \text{ OR } H' = \begin{bmatrix} 0 & 0 & 0 & 0 & 0 \\ 0 & 0 & 0 & 0 & 0 \\ 2 & 2 & 0 & 2 & 2 \\ 0 & 0 & 0 & 0 & 0 \\ 0 & 0 & 0 & 0 & 0 \end{bmatrix}$$

$$I = \begin{bmatrix} 0 & 1 & 0 & 1 & 0 \\ 1 & 0 & 1 & 0 & 1 \\ 0 & 1 & 0 & 1 & 0 \\ 1 & 0 & 1 & 0 & 1 \\ 0 & 1 & 0 & 1 & 0 \end{bmatrix}$$

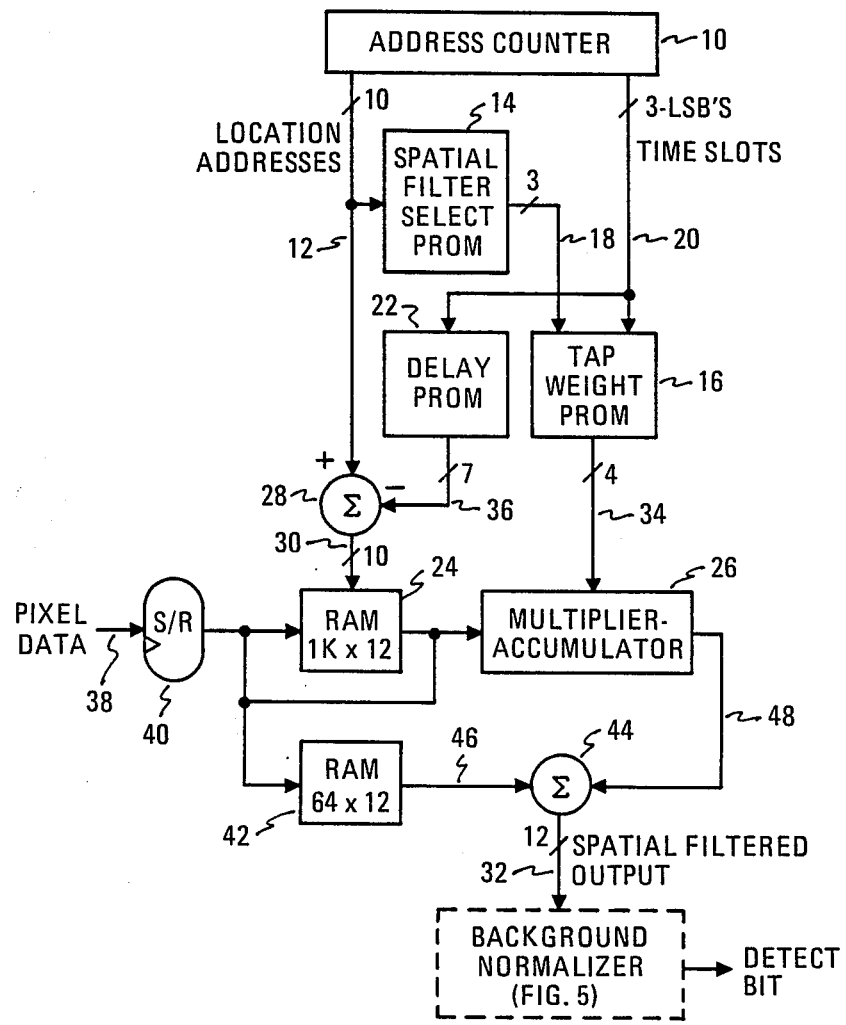

FIG. 6 NORMALIZER MASK DELAY VALUES

A OR A' =

| | | 64 | 32 | |
| --- | --- | --- | --- | --- |
| | | | 1 | |
| | | 2 | | |
| | | | | |
| | | | | |

B OR B' =

| | | | | |
| --- | --- | --- | --- | --- |
| | | | | |
| | | | | |
| | 68 | | | |
| | 36 | 3 | 2 | |

C OR C' =

| | | | | |
| --- | --- | --- | --- | --- |
| 131 | 130 | | | |
| | | | | |
| 100 | 68 | | | |
| | | | | |

D OR D' =

| | | 96 | 64 | |
| --- | --- | --- | --- | --- |
| 130 | 129 | | | |
| | | | | |
| | | | | |
| | | | | |

E OR E' =

| | | 96 | 32 | |
| --- | --- | --- | --- | --- |
| 129 | | | 1 | |
| | | | | |
| | | | | |
| | | | | |

F OR F' =

| | | | 32 | |
| --- | --- | --- | --- | --- |
| | | | 1 | |
| | | | 3 | |
| | | 36 | | |
| | | | | |

G OR G' =

| | | | | |
| --- | --- | --- | --- | --- |
| | | | | |
| 131 | | | 3 | |
| 100 | | 36 | | |
| | | | | |

H OR H' =

| | | 96 | | |
| --- | --- | --- | --- | --- |
| 129 | | | | |
| 131 | | | | |
| 100 | | | | |
| | | | | |

I =

| | | 96 | 32 | |
| --- | --- | --- | --- | --- |
| 129 | | | 1 | |
| 131 | | | 3 | |
| 100 | | 36 | | |
| | | | | |

//
LOCATION DEPENDENT SIGNAL PROCESSOR

The Government has rights in this invention pursuant to Contract F33615-83-C-1015 awarded by the Department of the Air Force.

FIELD OF THE INVENTION

The present invention relates to signal processors for video and infrared detection systems, and more particularly relates to such processors adapted to provide spatial filter and/or background normalizer functions in multi-detector array systems.

BACKGROUND ART

Radiant energy detection systems for use in the visible and infrared portions of the spectrum typically utilize a large number of individual radiation-sensitive elements arrayed in a rectangular grid with the individual elements of the array being "read" or scanned in raster fashion, each picture element ("pixel") within the grid becoming the output pixel in predetermined sequence. Many such systems employ spatial filtering or background normalization for enhancing the capability of the system to detect point sources of radiant energy in the presence of clutter, interference or other background noise. As commonly implemented such filters and normalizers require the sensing not only of the signal from the output pixel itself, but also signals from a number of neighboring pixels the readings from which then are combined in known manner with each other and with the output pixel to correct for background noise as measured at these additional pixel locations.

Such correction signal generally is derived from readings taken from the pixels of a multipixel moving "window" or "mask" which is centered over the output pixel itself and scans with it. Typically such mask may comprise a 3×3 square matrix of pixels for spatial filtering applications and a 5×5 matrix for background normalizers. The signal as read from the output pixel then is weighted, in the case of spatial filters, or thresholded in the case of background normalizers, in accordance with a signal derived from the signals read from the other pixels comprising the mask. These are themselves weighted and combined in a manner appropriate to the filter or normalizing function being implemented.

Problems arise when the pixel mask is attempted to be scanned to the detector elements situated in the outermost rows and columns of the array, because when the output pixel at the mask center has reached such peripheral row or column, the pixels on the lead or forward side of the mask have run off the adjacent edge of the array or "wrapped around" to the start or end of the next row or column in the raster pattern being scanned. A like problem exists at the initialization of each scan line, when beginning the scan of each row and column, where only some part of the mask will be positioned over the array and some part will lie outside its edges.

To avoid the degradation of accuracy of spatial filtering or normalizing which results from these initialization and wrap-around phenomena, it is known to start and terminate each horizontal and vertical scan at a point one or more pixels removed from the ends of each row and column, so as to make the full scan window remain always within the periphery of the array. By thus discarding or neglecting the outer pixel outputs the problems of initialization and wrap-around are avoided, but there is a price which must be paid. The effective area of the array is substantially reduced; in the particular case of the 5×5 mask for a 32×32 array background normalizer as described above, for example, such reduction is more than 23%. This effective reduction of array size results in a corresponding reduction of the available field of view of the system and of its performance capability.

The processor of the present invention may incorporate either or both a spatial filtering and a background normalizer function with no reduction of available field of view, and without substantial compromise of performance of the filter and normalizer functions even at the peripheral edges of the array. Further, these objectives are achieved with little if any increase in complexity or cost of the processor.

Therefore, it is a primary object of the present invention to provide a signal processor for a signal detection system which avoids the initialization and wrap-around effects associated with implementation of two-dimensional spatial filters and background normalizers for the signal processing functions in video and infrared detection systems. It is another object of the invention to provide a location dependent signal processor that minimizes the impact of initialization and wrap-around effects on spatial filter weighting and background normalizer thresholding while avoiding reduction of available field-of-view.

SUMMARY OF THE INVENTION

These and other objects are achieved by providing a location dependent signal processor which, for a two-dimensional spatial filter, includes means for adaptively controlling the signal processing operations as a function of the present location of the output pixel and its associated spatial filter mask, which typically may comprise the eight pixels immediately surrounding the output pixel. An address counter provides a present location address as each pixel of the array is scanned, along with three least significant bits (LSB's) to give eight time slots in each pixel read or "cell" time. A spatial filter select PROM receives such location address, determines which spatial filter to use and provides an input accordingly to a tap weight PROM which receives also the time slot input from the address counter. The "select" input to the tap weight PROM controls which of a number of stored sets of spatial filter tap weights is selected, and the time slot input controls the readout of tap weights from this selected set properly sequenced for each of the eight pixels of the filter mask.

The time slot output from the address counter is also applied to a delay PROM which provides a delay value corresponding to each pixel of the filter mask. This delay value is subtracted from the present address location and the result applied to a data RAM in which pixel data for the entire frame is stored. The pixel data read from this RAM is fed to a multiplier-accumulator which multiplies the data for each pixel by its corresponding tap weight out of the tap weight PROM. The multiplier accumulator performs eight multiply-accumulates (for a 3×3 mask) for each cell time for each pixel. This accomplishes a summation of the multiplied pixel values and accumulation of these values for the eight pixels of the mask. The output pixel, which does not require a different weight, is delayed by an appropriate amount to center it in the mask and the data from the accumulator is added to such delayed data value to form the spatially filtered signal output.

A location dependent background normalizer similarly includes an address counter providing pixel location and time slot outputs, a background normalizer select PRO and a delay PROM, but does not require a tap weight PROM. In the background normalizer, the delay PROM is programmed differently for each normalizer mask by storing in the delay PROM a different set of pixel weighting and delay values for each different configuration of the normalizer mask as selected by the normalizer select PROM and the time slot input. The normalizer masks typically may comprise a 5×5 pixel square, with readings taken only from the outside rows and columns of the square. The weighted magnitudes for each pixel are accumulated and multiplied in a multiplier-accumulator by a variable normalizer value determined from the average number of detections per frame. The product constitutes a threshold against which the output pixel signal magnitude is compared. If the threshold is exceeded a detection is declared. The number of detections per frame then is compared against a preset value of detections and the variable normalizer value adjusted accordingly.

BRIEF DESCRIPTION OF THE DRAWINGS

FIG. 1 shows a spatial array illustrating the locations of problem areas in the operation of spatial filters and -background normalizers:

FIG. 2 shows a spatial filter mask having a 3×3 array with the respective delays for each pixel comprising the mask;

FIG. 3 shows the different location dependent spatial filter weights associated with each array location shown in FIG. 1:

FIG. 4 is a system block diagram of the location dependent spatial filter of the present invention;

FIG. 6 shows the different delay values which a 5×5 background normalizer mask has at different array locations; and FIG. 7 shows the different location dependent background normalizer weights associated with each array location shown in FIG. 1.

DESCRIPTION OF THE PREFERRED EMBODIMENT

Figure 5:
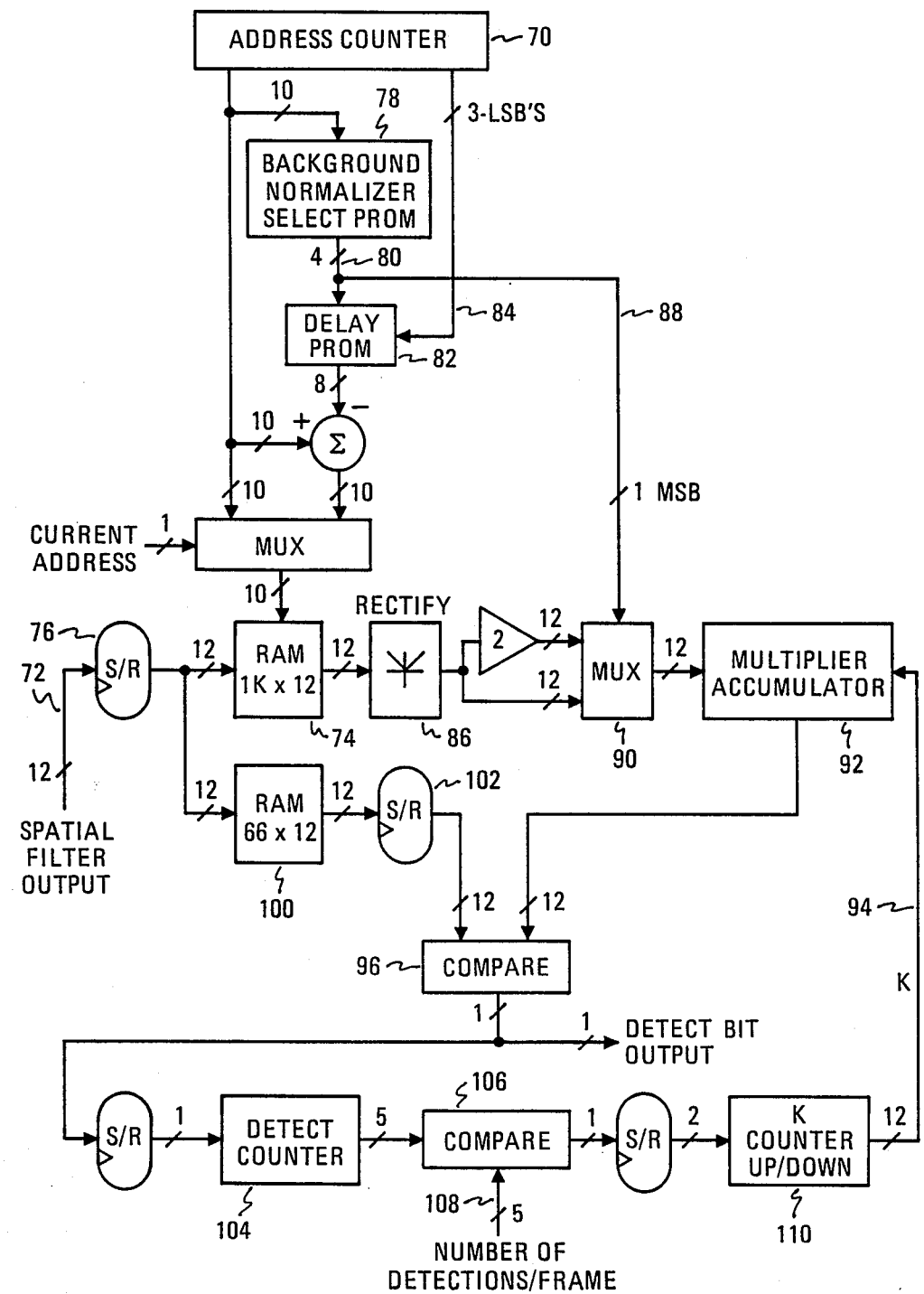
FIG. 5 is a system block diagram of the location dependent background normalizer of the present invention.

FIG. 1 illustrates pixel locations for a 32×32 detector element array, with the elements disposed in a rectangular grid and scanned left-to-right, top-to-bottom in raster fashion. Where the associated processor is to provide a spatial filter or background normalizer function, the array is scanned by a multi-element pixel window or mask of form such as shown in FIG. 2, with the pixel from which the output reading is taken (the "output pixel") being centered within the mask. The output pixel is surrounded by a number of other pixels from which signals also are read for use in deriving a filter weighting or normalizer thresholding parameter, to be applied to the output pixel signal in a manner appropriate to the filtering or normalizing function to be implemented.

The 3×3 mask shown in FIG. 2 would be suitable for spatial filter processing. For the background normalizing function a 5×5 or larger mask is more suitable, with the output pixel again being centered in the mask. Here the normalizer input readings are taken only from pixels which are once or more removed from the output pixel itself, with no readings being input from the immediately adjacent pixels. This difference in mask format is attributable to the fact that normalizers are intended to distinguish signals of relatively large area extent rather than signals of relatively large amplitude gradient as in spatial filtering.

Regardless of mask size, when the output pixel is located sufficiently close to an edge of the detector array at the beginning or end of a scan line or frame, some part of the mask will fall outside the periphery of the array thus creating the initialization and wraparound problems hereinbefore discussed. As illustrated in FIG. 1, such problems arise with a 3×3 spatial filter mask whenever the center or output pixel is at any of the locations designated A through H, and with a 5×5 background normalizer they additionally occur at the locations designated A' through H'.

As previously mentioned, one possible remedy for these problems is simply to terminate each scan at a pixel location sufficiently remote from the edge of the array that the entire mask remains always within its periphery, but this necessarily entails a very substantial loss of effective array size and available field of view. In accordance with the present invention a more satisfactory solution is provided through adaptive control of the weighting of the signals read from the mask pixels as a function of mask location on the array.

Thus a different set of pixel weights is provided for each of the mask locations at which one or more pixels comprising the mask would fall outside an edge of the array, as at A-H in FIG. 1. For the spatial filter application, a suitable pixel weight set for each different mask location on the array is shown in FIG. 3, wherein each of the letters A through I identifies a weight set corresponding to the similarly lettered location designation in FIG. 1. It will be noted that the weighting assigned to the center or output pixel is in all cases a "1", and that zero weight is assigned to each of those pixels which would lie outside the array periphery, as some do in all of the weight sets except I. The weighting assigned to each of the other pixels of the mask at locations A-H, as well as those at mask location I in the center section of the array, then may be selected to optimize the spatial filter function. Suitable values for these weights are shown in FIG. 3, with alternative weighting indicated in the case of the I set.

Referring now to FIG. 4, there is shown a system block diagram of the location dependent spatial filter of the present invention. The processor includes an address counter 10 providing a sequence of location addresses on output line 12 each corresponding to one pixel cell in the two-dimensional array, the addresses being sequenced in a manner such that the pixel cells are scanned in conventional raster fashion. Each location address may comprise 10 bits so as to count by one for each pixel location, from 0 to 1023 in the case of a 32×32 array. Each pixel location has its own associated spatial array window or mask, in the form of a 3×3 matrix centered over the output pixel as previously described. The location address on line 12 is received by a spatial filter select PROM 14 which in turn selects, via a 3-bit input on line 18 to a tap weight PROM 16, a particular one of the sets of spatial filter tap weights stored in PROM 16. The members of these stored sets have the weights indicated in FIG. 3.

The three least significant bits (LSB's) from address counter 10 are provided on output line 20 to the tap weight PROM 16 as well as to a delay PROM 22 which has the spatial filter mask delay values as its memory. These values are indicated on FIG. 2 for a 3×3 mask scanning a 32×32 array, and as there shown they are 0, 1, 2, 32, 34, 64, 65 and 66. The three least significant bits on 20 address and select the appropriate tap weight for each pixel in that one of the stored sets of filter weights which is selected by the input to PROM 16 from the spatial filter select PROM 14. This process is repeated for each of the eight time slots in each cell time, to thus read out in proper sequence all the filter weights of the selected set except that of the output pixel, which always is given unit weighting.

The 3-LSB output on line 20 also is applied to a delay PROM 22, which comprises a set of delay values that are subtracted from the current pixel address for accessing signal data corresponding to each pixel of the mask, again excepting the output pixel. Such data is stored in a RAM 24 which acts as a large shift register for the entire frame of data for a 32×32 array (1024 pixel sites). The delays from the delay PROM 22 are subtracted from the address location on line 12 out of the address counter 10 by a subtraction device 28. This produces on line 30 a resultant address location used to access the appropriate data in RAM 24 at the right delay time, and to read this data into the multiplier-accumulator 26. The pixel input data is fed to the RAM 24 via input line 38 and a shift register 40 which also feeds the incoming data to another RAM 42 for application to a summing device 44. RAM 42 stores the tap weight of "1" for the center or output pixel which is always of unity value, and also introduces the appropriate time delay (33 cell times as indicated in FIG. 2) needed to center the output pixel in the filter mask. The summing device 44 produces the spatially filtered output signal on line 32 by adding to the center pixel signal on line 46 the output on line 48 from the multiplier-accumulator 26.

This multiplier-accumulator performs eight multiply-accumulate operations during each cell time for each of the pixels in the 32×32 array. For example, when the address counter 10 is at pixel location 64, the spatial filter output on the line 32 will be for the pixel 31 (after subtraction of the 33 cell times necessary to center the output pixel). Pixel 31 is location B in FIG. 1, so the filter mask weight set designated B in FIG. 3 is selected. With mask B, the system first subtracts 0 from the current address, multiplies the pixel value by 0 and loads the result into the multiplier-accumulator 26; then subtracts 1 from the current address, multiplies by minus 1 and accumulates the result; then subtracts 2 from the current address, multiplies by 1 and accumulates the result; then subtracts 32 from the current address, multiplies by 0 and accumulates the result; then subtracts 34 from the current address, multiplies by minus one and accumulates the result; and so on for each pixel of the filter mask. The subtraction values used in this process are the delay times shown in FIG. 2 for the eight filter mask pixels, and the multipliers are the spatial filter weights shown in FIG. 3, using the weight set designated B in this particular example. The product of this process is read from multiplier-accumulator 26 and added to the output pixel data (properly delayed to center it in the filter mask) and the result constitutes the spatial filtered output signal to the background normalizer.

FIG. 5 is a system block diagram of the location dependent background normalizer of the present invention. A spatially large signal may be caused by clutter such as clouds or by phenomena such as modulation transfer widening of a point source by the system ahead of the background normalizer, or by a close range signal. To counteract these phenomena, the background normalizer uses an adaptive threshold window to compare the output pixel signal to a threshold. A detection is declared if the threshold is exceeded.

As shown in FIG. 5, an address counter 70 provides the location of the output pixel in the array along with the three least significant bits (LSB's) to give eight time slots in one cell time. The first time slot is divided in half to provide an additional time slot. Incoming data representing the spatial filter output on line 72 is written into RAM 74 via shift register 76 during the first half of this first time slot. During the second half of the first time slot, the first weighted pixel accumulation is performed in a multiplier-accumulator 92, as in the spatial filter of FIG. 2. Here it may be noted that the spatial filter does not require such split first time slot since its first weighted pixel is the incoming data (zero delay), and this data is stored in RAM and multiplied by its tap weight simultaneously. With the background normalizer, however, the first weighted pixel always has a non-zero delay. Hence, during the first ⅛ of the cell time the incoming data is quickly written into RAM, and the appropriate data is accessed for the first weighted pixel accumulation. The remaining seven weighted pixel accumulations are performed in the last ⅞ of the cell time, one accumulation per ⅛ cell time.

FIG. 6 shows nine background normalizer masks A-A' through I, each of 5×5 pixel configuration, with delay values indicated for each pixel which is to have a non-zero weighting. The weights for the pixels of these masks are shown in FIG. 7, from which it may be observed that only the pixels of the outer rows and columns of the masks are used and those immediately adjacent the center or output pixel are not. From FIGS. 6 and 7 it is also apparent that only background normalizer I has eight weighted pixel accumulations. The other background normalizers only require four weighted pixel accumulations per signal under test. In these situations, the incoming data is still written into RAM during the first half of the first ⅛ of the cell time. The four weighted pixel accumulations are performed during the last 4/8 of the cell time. Consequently, irrespective of which background normalizer mask is in use at any time, the weighted pixel accumulation is complete at the end of each cell time.

A background normalizer select PROM 78 receives a location address and determines which of the nine background normalizer masks to use, and accordingly provides a location on line 80 which selects the appropriate set of pixel weights stored in a delay PROM 82. The three least significant bits on line 84 from the address counter 70 select the specific delays from the delay PROM 82 for each pixel. The background normalizer mask delays from the delay PROM 82 are subtracted from the address location to access the appropriate pixel data stored in RAM 74. The pixel data is then rectified by rectifier 86.

Since all the tap weights for each background normalizer are either zero and one or are zero and two (FIG. 7), the need for a tap weight PROM is avoided by always multiplying the pixel data by zero or one. Subsequently, the data is adjusted by doubling it if necessary. All of the border background normalizers (background normalizers A-A' through H-H' are doubled. Only the center background normalizer (background normalizer I) is not doubled. Hence, the most significant bit (MSB)

on line 88 out of the background normalizer select PROM 78 can be used to control the doubling multiplexer (MUX) 90. The pixel data is further fed to a multiplier/accumulator 92 which multiplies the data for each pixel by a positive normalizer value (K) from line 94 to adjust the threshold level. The accumulated result is then compared in comparator 96 with the actual pixel signal under test from line 98 which is stored in a register 66 pixels deep in RAM 100 and provided via shift register 102 to the comparator.

The positive normalizer value (K) is determined according to the number of detections declared per frame. The number of detections from the aforementioned comparison at 96 are summed by counter 104 for each frame. This sum is compared in comparator 106 to a desired number of detections declared per frame preset by an operator input on line 108. If the sum is less than such preset number, the normalizer value is lowered by an up/down K counter 110 by one count per frame until the sum increases to equal the preset number. Lowering the normalizer value lowers the threshold thereby creating more detections and increasing the sum. Similarly, if the sum is greater than the preset number of detections declared per frame the normalizer value is increased by one each frame. The sum then decreases until it equals the preset number.

In operation of the processor of FIG. 5, suppose the address counter 70 is at address N somewhere in the center of the array. The background normalizer mask selected by PROM 78 then is I (FIG. 7) and the delays are 1, 3, 32, 36, 96, 100, 129 and 131 (FIG. 6). The pixel under test is at location N-66. Therefore, the multiplier/accumulator output is:

$$MACOUT = K^*/\text{Data } (N - 1)/ + K^*/\text{Data } (N - 3)/ +$$
$$K^*/\text{Data } (N - 32)/ + K^*/\text{Data } (N - 36)/ +$$
$$K^*/\text{Data } (N - 96)/ + K^*/\text{Data } (N - 100)/ +$$
$$K^*/\text{Data } (N - 129)/ + K^*/\text{Data } (N - 131)/$$

where Data (X) is the data at pixel location X.

The detect bit is then:
detect bit = 1
if Data (N-66) > MACOUT, or:
detect bit = 0
if Data (N-66) ≦ MACOUT.

This type of comparison is done for every pixel in the array. At the end of the frame, if the detection counter 104 is greater than the preset number of detections per frame, then K becomes K+1. For a constant scene, K continues to increase linearly each frame until the detection counter 104 equals the preset number, say M frames for instance. At that point, the normalizer values will toggle between that value and its immediate previous value every frame. That is, the normalizer value would be K+M, then K+M−1, then back to K+M, and so on. Similarly, when the detection counter is less than the number of detections per frame the normalizer value will decrease.

While the invention has been described above with respect to its preferred embodiments, it should be understood that other forms and embodiments may be made without departing from the spirit and scope of the invention. It will also be appreciated that while the processor as described performs both spatial filtering and background normalizer functions, the invention has application to processors performing only one of these or similar signal detection enhancement functions.

What is claimed is:

1. A signal processor for use with a multi-pixel array for detecting point sources of radiant energy in the presence of background noise, comprising:
   address means for sequentially addressing the pixels of said array in predetermined order such that each pixel in turn becomes the output pixel;
   background pixel selection means responsive to said address means for selecting a plurality of background pixels surrounding said output pixel and together comprising at least one mask centered on said output pixel as the output pixel is sequenced from pixel to pixel of the array;
   means for storing a plurality of sets of weight values for the background pixels of said mask with the weight values of such sets being dependent on the location of said output pixel on the array, the weight values of each such set for output pixel locations at which any of the surrounding background pixels comprising said mask lie outside the adjacent edge of the array being zero for all members of that set corresponding to such off-array pixels;
   weight selection means responsive to said address means for selecting the one of said stored weight sets appropriate to the present location of said output pixel and selecting sequentially from such one set the stored weight value to be applied to each background pixel of said mask;
   multiplier-accumulator means for multiplying each background pixel value by its selected weight value and accumulating the results of such multiplications for all background pixels of said mask; and
   means for applying to the output pixel signal the output of said multiplier-accumulator means to provide a processor output free of initialization and wrap-around effects.

2. A signal processor as defined in claim 1 wherein said plurality of background pixels together comprise a single mask defined by time delay values correlated with the relative positions on the array of said output pixel and the background pixels comprising said single mask; and
   wherein said means for selecting said background pixels and said means for selecting the stored weight value to be applied to each such pixel operate under control of a time input from said address means.

3. A signal processor as defined in claim 2 wherein said single mask comprises a spatial filter mask in the form of a 3×3 pixel matrix having said output pixel centered therein;
   wherein said means for storing said weight value sets comprises a tap weight memory into which is programmed a number of sets of pixel weighting values to provide one such set for each output pixel position on the array at which some part of said filter mask is off the adjacent edge of the array; and
   wherein said selection means for selecting from the weight sets stored in said tap weight memory makes such selection in response to an address input from said address means.

4. A signal processor as defined in claim 1 wherein said plurality of background pixels together comprise a plurality of masks each defined by a set of time delay values correlated with one position of the array of said output pixel and the background pixels comprising that mask; and wherein said means for selecting said background pixels and said means for selecting the stored weight value to be applied to each such pixel operate under control of a time input from said address means.

5. A signal processor as defined in claim 4 wherein each of said plurality of masks comprises a background normalizer mask in the form of a 5×5 pixel matrix having said output pixel centered therein; and wherein said means for storing said weight value sets comprises a memory into which is programmed a number of sets of pixel weighting values to provide one such set for each output pixel position on the array at which some part of said filter mask is off the adjacent edge of the array.

6. A two-dimensional spatial filter processor for use with a radiant energy detector array which includes a plurality of sensor elements that are sequentially scanned with each in turn becoming the output pixel and in which initialization and wrap-around problems arise at output pixel locations adjacent the periphery of the array, comprising:

address means providing a sequential addressing of the pixels of said array in predetermined order such that each pixel in turn becomes the output pixel during one pixel read time, said address means further providing a time output defining a plurality of time slots per pixel read time;

means responsive to the time slot output of said address means for defining a spatial filter mask comprising a 3×3 grid of background pixels that is centered on and moves with said output pixel as it is sequenced from pixel to pixel of the array;

tap weight memory means for storing a plurality of sets of weight values for the background pixels comprising said filter mask with tho weight values of each such set being matched to the location of said mask and output pixel on the array, the weight values of each such set for filter mask locations at which any of the pixels comprising the mask fall outside the adjacent edge of the array being zero for all such off-array pixels;

weight selection means responsive to the address and time outputs of said address means for selecting the one of said stored weight sets matched to the present location of said filter mask and selecting sequentially from such one set the stored weight value to be applied to each pixel of said mask;

background pixel selection means responsive to the address and time outputs of said address means to select sequentially the background pixel signal value to which the stored weight value selected by said weight selection means is to be applied;

multiple-accumulator means for multiplying each such selected background pixel value by its selected weight value and accumulating the results of such multiplications for the background pixels of said filter mask; and means for applying to the output pixel signal the output of said multiplier-accumulator means to provide a spatially filtered processor output.

7. A processor as defined in claim 6 wherein said background pixel signal selection means comprises delay memory means storing time delay values defining the relative positions of said output pixel and each of said background pixels in the spatial filter mask formed thereby; and further including means for subtracting from the address output of said address means a delay value read from said delay memory means in response to the time output from said address means, to thus obtain the address of the background pixel signal to which the selected filter weight value is to be applied.

8. For use with a multi-pixel radiant energy detector array having output pixel location dependent areas at which initialization and wrap-around problems require avoidance, a background normalizing processor comprising:

address means providing time slot and address outputs for sequentially addressing the pixels of said array in predetermined order such that each pixel in turn becomes the output pixel;

memory means storing a plurality of normalizer masks each comprising a set of time delay values with each such value defining the location of one element of a background pixel matrix that is and remains centered on the output pixel as sequentially addressed;

memory means storing a different set of normalization weight values for the background pixels of a corresponding one of said normalizer masks with the normalization weight values being dependent on the location of such mask, the normalization weight values of each such set for normalizer mask locations at which any of the pixels comprising the mask fall outside the adjacent edge of the array being zero for all such off-array pixels;

weight set selection means responsive to the address output of said address means for selecting the one of said stored normalization weight sets appropriate to the present location of said output pixel;

weight selection means responsive to the time slot output of said address means for selecting sequentially from such one set the stored normalization weight value to be applied to each background pixel of the corresponding one of said normalizer masks;

weighting means responsive to said weight selection means and to said address means for weighting each of said background pixels in accordance with said selected normalization weight value and accumulating the weighted signals; and comparator means for effecting a comparison of the output pixel signal and the normalized background signal and declaring a detection.

9. A processor as defined in claim 8 wherein each of said normalization weights is of value equal to "0", "1" or "2"; and wherein said weighting means applies such "0" value to appropriate background pixels by not reading such pixels to said comparator, applies such "1" value to appropriate background pixels by reading such pixels to said comparator, and applies such "2" value to appropriate background pixles by doubling the value thereof as read to said comparator.

10. A processor as defined in claim 8 further including means for multiplying said normalized background signal as applied to said comparator means by a multiplier adaptively derived by comparison of the number of detections in each frame against a preset number of detections per frame.

* * * * *